US012728482B2

(12) United States Patent
Jacob et al.

(10) Patent No.: US 12,728,482 B2
(45) Date of Patent: Sep. 8, 2026

(54) LASER MARKING SYSTEM AND METHOD

(71) Applicant: SILICON LIGHT MACHINES CORPORATION, San Jose, CA (US)

(72) Inventors: Gregory Jacob, Santa Clara, CA (US); Stephen Hamann, Mountain View, CA (US); Alexander Payne, Ben Lommond, CA (US); Lars Eng, Los Altos, CA (US); James Hunter, Campbell, CA (US)

(73) Assignee: SILICON LIGHT MACHINES CORPORATION, San Jose, CA (US)

( * ) Notice: Subject to any disclaimer, the term of this patent is extended or adjusted under 35 U.S.C. 154(b) by 1224 days.

(21) Appl. No.: 17/591,884

(22) Filed: Feb. 3, 2022

(65) Prior Publication Data

US 2022/0250188 A1 Aug. 11, 2022

Related U.S. Application Data

(60) Provisional application No. 63/183,789, filed on May 4, 2021, provisional application No. 63/146,488, filed on Feb. 5, 2021.

(51) Int. Cl.

*B29C 64/135* (2017.01)
*B23K 26/064* (2014.01)
*B81B 3/00* (2006.01)

(52) U.S. Cl.

CPC .......... *B23K 26/064* (2015.10); *B81B 3/0083* (2013.01); *B81B 2201/047* (2013.01)

(58) Field of Classification Search

CPC ............ B81B 2201/047; B81B 3/0083; B23K 26/064

(Continued)

(56) References Cited

U.S. PATENT DOCUMENTS 5,459,610 A 10/1995 Bloom et al.
5,661,592 A * 8/1997 Bornstein ............ G02B 5/1828 359/224.1

(Continued)

OTHER PUBLICATIONS

European Search Report for International Application 22750482.6-1001 / 4288292 PCT/US2022015347 Feb. 25, 2025.

(Continued)

*Primary Examiner* — Jimmy Chou
(74) *Attorney, Agent, or Firm* — William Nuttle

(57) ABSTRACT

A laser marking system including a spatial light modulator (SLM) with a multi-pixel, linear array of is microelectromechanical systems (MEMS) based diffractors, and methods of operating the same are disclosed. Generally, the system includes, in addition to the SLM, a laser operable to illuminate the SLM; imaging optics operable to focus a substantially linear swath of modulated light onto a surface of a workpiece, the linear swath including light from multiple pixels of the SLM, and a controller operable to control the SLM, laser and imaging optics to mark the surface of the workpiece to record a two-dimensional image thereon. In one embodiment, the diffractors include a number of electrostatically deflectable ribbons suspended over a substrate. In another, each diffractor is two-dimensional including an electrostatically deflectable first reflective operable to brought into optical interference with light reflected from a second reflective surface on a faceplate, or an adjacent diffractor.

18 Claims, 13 Drawing Sheets

(58) Field of Classification Search
USPC ....................................................... 219/121.6
See application file for complete search history.

(56) References Cited

U.S. PATENT DOCUMENTS 5,703,709 A * 12/1997 Mori ........................ B41M 5/34 347/256
5,719,682 A 2/1998 Venkateswar
6,388,780 B1 * 5/2002 Monaghan ............... G03H 1/30 359/25
7,064,883 B2 * 6/2006 Payne .................. G02B 26/001 359/290
7,215,461 B1 * 5/2007 Leung ................ G02B 26/0841 359/566
7,227,687 B1 * 6/2007 Trisnadi ............. G02B 26/0841 359/279
7,277,110 B2 * 10/2007 Zarem ........................ B41J 2/32 347/185
8,285,131 B1 * 10/2012 Myatt ................ G02B 26/0808 396/20
8,842,359 B1 * 9/2014 Payne ................ G02B 26/0808 359/291
11,016,287 B2 * 5/2021 Payne ................ G02B 26/0808
11,327,288 B2 * 5/2022 Haarstrich ........... G02B 21/367
2003/0011672 A1 1/2003 Emge et al.
2004/0001264 A1 * 1/2004 Gudeman .......... G02B 26/0808 359/883
2004/0057101 A1 * 3/2004 Hunter ............... G02B 26/0841 359/290
2005/0212004 A1 * 9/2005 Payne ................ G02B 26/0808 257/98
2005/0212893 A1 * 9/2005 Zarem ........................ B41J 2/32 347/185
2006/0098266 A1 * 5/2006 Payne ................ G02B 26/0808 359/291
2008/0179182 A1 * 7/2008 Remadna ............. G02B 26/001 216/13
2010/0149625 A1 * 6/2010 Lu ....................... B81C 1/00238 359/291
2010/0239299 A1 * 9/2010 Mori ...................... G03G 15/55 219/494
2012/0044569 A1 2/2012 Maak et al.
2016/0085067 A1 * 3/2016 Payne .................. G02B 5/0825 219/121.61
2018/0039073 A1 2/2018 Delphi
2018/0299664 A1 * 10/2018 Payne .................... G02B 26/10
2019/0116346 A1 * 4/2019 Hashimoto ........ G02B 13/0005
2020/0026066 A1 * 1/2020 Payne ................ G02B 26/0841
2020/0247052 A1 * 8/2020 Payne .................. B23K 26/066
2020/0371344 A1 11/2020 Eng et al.
2020/0376594 A1 12/2020 Grapov et al.

OTHER PUBLICATIONS

International Search Report for International Application PCT/US22/15347 May 12, 2022.

Written Opinion of International Searching Authority Application PCT/US22/15347 May 12, 2022.

* cited by examiner 408
406
404
401
400
408
410
402

LASER MARKING SYSTEM AND METHOD

CROSS-REFERENCE TO RELATED APPLICATIONS

This application claims the benefit of priority under 35 U.S.C. 119(e) to U.S. Provisional Patent Application Ser. No. 63/146,488, filed Feb. 5, 2021, and to U.S. Provisional Patent Application Ser. No. 63/183,789, filed May 4, 2021, both of which are incorporated by reference herein in its entirety.

TECHNICAL FIELD

The present invention relates generally to laser marking systems, and more particularly to laser marking systems including spatial light modulators with a multi-pixel, linear array of is a microelectromechanical systems based diffractors, and methods of operating the same.

BACKGROUND

Laser marking systems are used in a wide range of industries to create an image or mark, such as text, logos, barcodes, or two-dimensional, QR codes on a surface of parts or articles. Common methods of marking include oxidizing, annealing, etching or ablating or discoloring the surface. Advantages of laser marking include that it can be performed on a wide variety of materials, it is permanent, and does not require physical contact to mark a surface of a workpiece.

Laser marking systems typically use a single laser beam that is scanned across the surface of the workpiece using galvanometric mirrors and print one spot at a time. Thus, depending on the size and complexity or density of pixels in the mark or image, current laser marking systems can have marking times of two minutes or more to mark the surface of a single workpiece. Additionally, attempts have been made to print or mark to larger areas using laser marking systems including spatial light modulators (SLM), such as digital micro-mirror devices (DMDs), commercially available from Texas Instruments, and liquid crystal on silicon (LCOS) modulators. However, these existing SLMs cannot handle the high power lasers needed to mark larger areas than a single spot at a time.

Accordingly, there is a need for a laser marking system capable of marking a larger area than a single spot at a time to decrease marking time and increase system throughput. Additionally, there is a further need for a laser marking system capable of using higher power lasers to both decrease marking time and increase an area that can be marked at a single time.

SUMMARY

A laser marking system with a spatial light modulator (SLM) including a multi-pixel, linear array of microelectromechanical systems (MEMS) based diffractors, and methods of operating the same are disclosed. Generally, the system includes, in addition to the SLM, a laser operable to illuminate the SLM; imaging optics operable to focus a substantially linear swath of modulated light onto a surface of a workpiece, the linear swath including light from multiple pixels of the SLM, and a controller operable to control the SLM, laser and imaging optics to mark the surface of the workpiece to record a two-dimensional image thereon.

In one embodiment, each of the MEMS based diffractors include a number of electrostatically deflectable ribbons suspended over a substrate, each ribbon having a light reflective surface. Eelectrostatic deflection of one or more of the ribbons brings light reflected from the light reflective surface of a first electrostatically deflectable ribbon into interference with light reflected from the light reflective surface of ribbons in the diffractors in same or adjacent diffractors to modulate light incident thereon.

In another embodiment, the MEMS based diffractors are two-dimensional diffractors, each including: a piston layer suspended over a surface of a substrate by posts at corners thereof, the piston layer including an electrostatically deflectable piston and a number of flexures through which the piston is coupled to the posts; a first reflective surface over a top surface of the piston; and a faceplate suspended over the piston layer, the faceplate including a second reflective surface on a top surface of the faceplate, and an aperture through which the piston exposed. Electrostatic deflection of the piston brings light reflected from the first reflective surface into interference with light reflected from the second reflective surface to modulate light incident thereon.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

DETAILED DESCRIPTION

A laser marking system including a spatial light modulator (SLM) with a multi-pixel, linear array of microelectromechanical systems (MEMS) based diffractors, and methods of operating the same are described herein with reference to figures.

In the following description, for purposes of explanation, numerous specific details are set forth in order to provide a thorough understanding of the present invention. It will be evident, however, to one skilled in the art that the present invention can be practiced without these specific details. In other instances, well-known structures, and techniques are not shown in detail or are shown in block diagram form in order to avoid unnecessarily obscuring an understanding of this description.

Reference in the description to “one embodiment” or “an embodiment” means that a particular feature, structure, or characteristic described in connection with the embodiment is included in at least one embodiment of the invention. The appearances of the phrase “in one embodiment” in various places in the specification do not necessarily all refer to the same embodiment. The term to couple as used herein can include both to directly electrically connect two or more components or elements and to indirectly connect through one or more intervening components.

Figure 1:
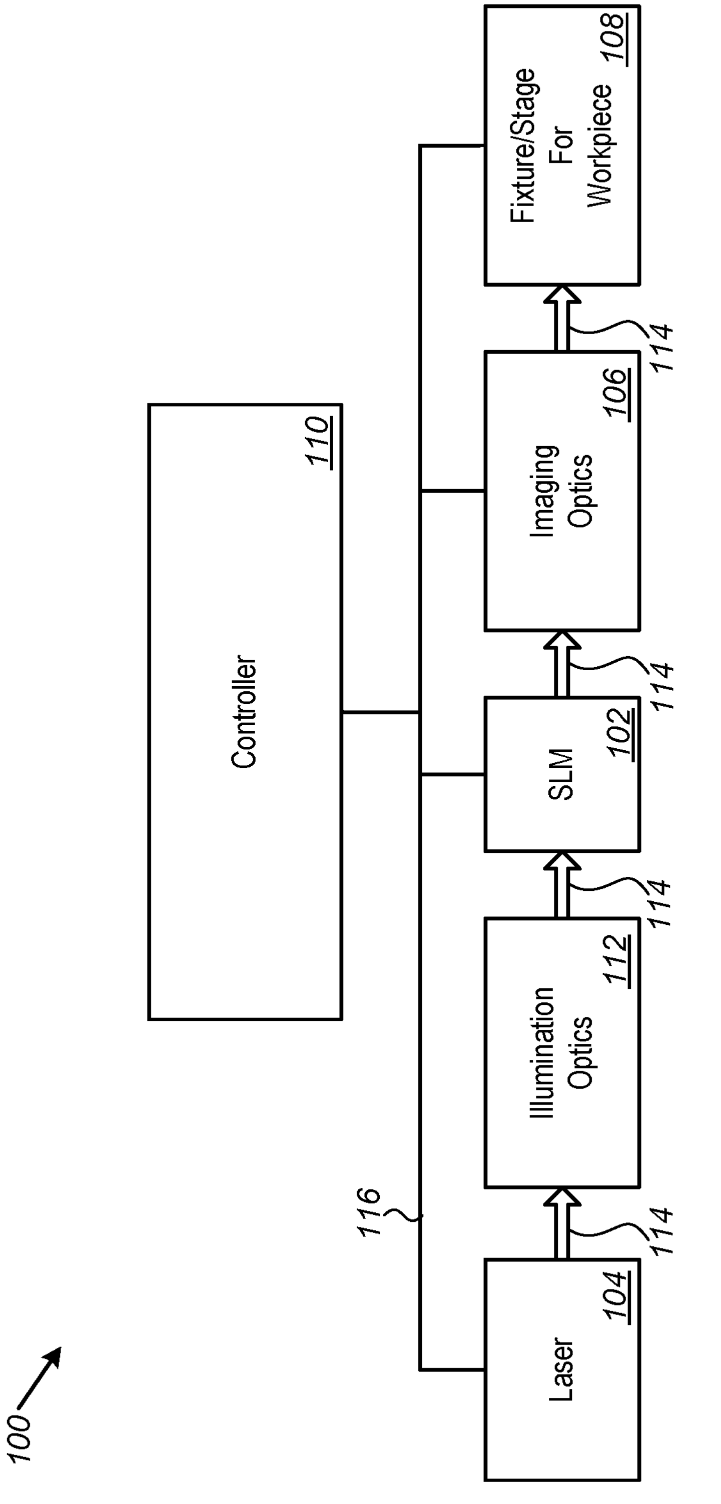
FIG. 1 is a block diagram of a laser marking system including a spatial light modulator (SLM)

FIG. 1 is a block diagram of a laser marking system 100 including a spatial light modulator (SLM 102) with a multi-pixel, linear array of Microelectromechanical System (MEMS) based diffractors (not shown in this figure). Briefly, the laser marking system 100 includes, in addition to the SLM 102, a laser 104 operable to illuminate the SLM, imaging optics 106 operable to focus a substantially linear swath of modulated light onto a surface of a workpiece on fixture 108 or stage, and a controller 110 operable to control the SLM, laser and imaging optics to scan the linear swath of modulated light across the surface of the workpiece to record a two-dimensional (2D) image thereon. Generally, as in the embodiment shown, the laser marking system 100 further includes illumination optics 112 with a beam forming optical system to direct a rectangular beam onto the linear array of the SLM 102.

Typically, the laser 104 is capable of operating in ultraviolet (UV) wavelengths of from 355 nanometers (nm) through infrared (IR) wavelengths up to about 2000 nm in either a continuous wave (CW) mode, or in a pulse mode with widths or durations of from about 1 femtoseconds (fs) up to about 500 nanoseconds (ns) at a repetition rate of from about 10 kHz up to about 300 kHz, and at energy ranges of from about 10 microjoules (μJ) up to greater than 10 millijoules (mJ). In one embodiment particularly useful for laser marking systems the laser 104 is capable of operating in visible wavelength (λ) of about 514 nm, at pulse energies of from about 200p at a pulse width or duration of about 260 fs and repetition rate of 100 kHz.

As noted above, the SLM 102 includes a multi-pixel; linear array of MEMS based diffractors grouped or coupled to provide from about 10 to about 1088 individually addressable pixels. Suitable SLM 102 include those having a linear array of ribbon-type, electrostatically adjustable diffraction grating, such as a Grating Light Valve (GLV™), and MEMS based two-dimensional (2D) diffractors, such as a Linear Planar Light Valve (LPLV™), both of which are commercially available from Silicon Light Machines Inc., of San Jose CA, and are described in detail hereinafter.

The imaging optics 106 can include dynamic optical elements, such as galvanometric mirrors, to scan the linear swath of modulated light across the surface of the workpiece, and a number of static optical elements to direct modulated light to the galvanometric mirrors and/or to focus the modulated light from the galvanometric mirrors onto the surface of the workpiece.

The fixture 108 on which the workpiece to be marked is placed or affixed can include a static fixture, or a movable stage operable to move or reposition the workpiece relative to a substantially stationary linear swath of modulated light, to scan the linear swath of modulated light across the surface of the workpiece. In either embodiment, whether static or movable, the fixture 108 preferably includes a number of sensors and signaling means to signal other components in the laser marking system when the workpiece is in proper position to be marked. In some embodiments, described in greater detail hereinafter, the fixture 108 includes a movable stage capable of being moved along two orthogonal axes to enable scanning multiple parallel swaths to record or mark larger 2D images on the workpiece. In other embodiments, laser marking system 100 includes both imaging optics 106 with galvanometric mirrors, and a movable stage (fixture 108) capable of being moved along a single axis orthogonal to the direction the galvanometric mirrors scan the linear swath of modulated light to record or mark larger 2D images on the workpiece.

The laser 104, illumination optics 112, SLM 102, imaging optics 106 and workpiece held on the fixture 108 are optically coupled in the direction indicated by arrows 114. Additionally, the laser 104, illumination optics 112, SLM 102, imaging optics 106 and fixture 108 are electrically coupled in signal communication with the controller 110 and each other through a control bus 116. In particular, controller 110 provides digital image data to the SLM 102, controls a power level of the laser 104, controls operation of galvanometric mirrors in the imaging optics 106 and controls the movable stage of the fixture 108 (where included) through the control bus 116. Additionally, the fixture 108 can signal the controller 110, SLM 102 and/or the laser 104 when the workpiece is in proper position to be marked, and the SLM can signal the laser when the image data loaded to the SLM is ready to be recorded on the workpiece so that the laser can be pulsed.

Optionally, as in the embodiment shown, the laser marking system 100 can further include a second axis or axes controller (not shown) electrically coupled in signal communication with the SLM 102, imaging optics 106 and movable stage of the fixture 108 (where included) through a second control bus 116 control movement of the linear swath along one of two orthogonal axes.

An embodiment of a SLM including a multi-pixel, linear array of MEMS based ribbon-type, electrostatically adjustable diffractors, such as a GLV™ will now be described with reference to FIGS. 2A through 2C. For purposes of clarity, many of the details of SLMs in general and MEMS based ribbon-type diffractors in particular that are not relevant to the present invention have been omitted from the following description. The drawings described are only schematic and are non-limiting. In the drawings, the size of some of the elements may be exaggerated and not drawn to scale for illustrative purposes. The dimensions and the relative dimensions may not correspond to actual reductions to practice of the invention.

Figure 2A:
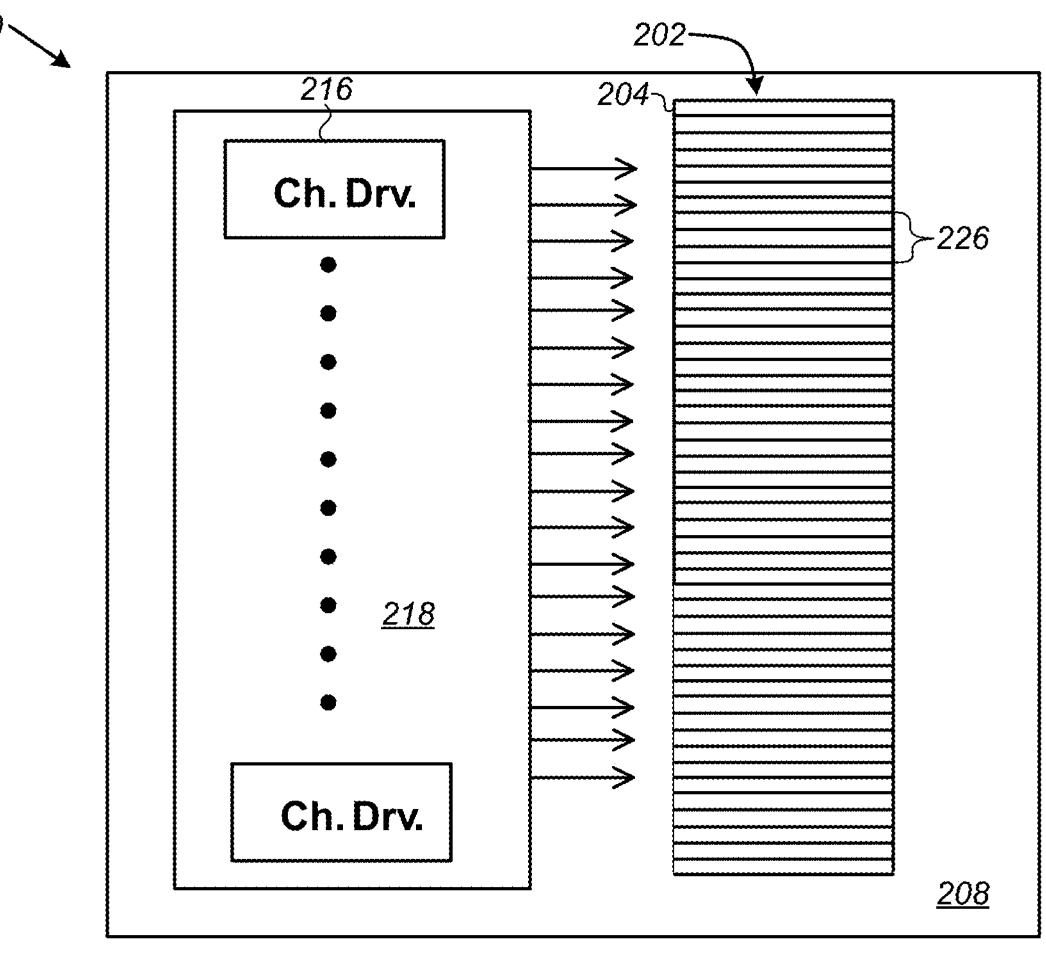
FIGS. 2A-2C are schematic block diagrams illustrating an embodiment of a SLM including ribbon-type Microelectromechanical System (MEMS) based diffractors.
Figure 2B:
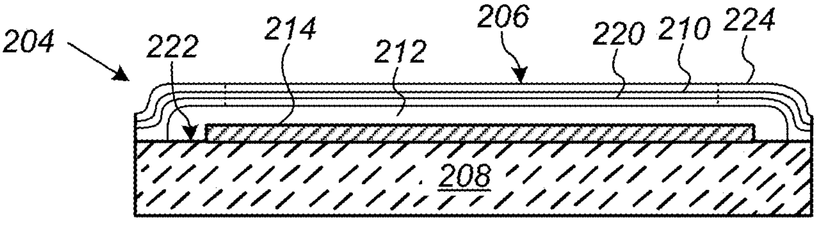

Referring to FIGS. 2A and 2B in the embodiment shown the SLM 200 includes a linear array 202 composed of thousands of free-standing, addressable electrostatically actuated ribbons 204, each ribbon having a light reflective surface 206 supported over a surface of a substrate 208, where a number of ribbons are grouped together to form the MEMS based diffractors. Each of the ribbons 204 includes an electrode 210 and is deflectable through a gap or cavity 212 toward the substrate 208 by electrostatic forces generated when a voltage is applied between the electrode 210 in the ribbon 204 and a base electrode 214 formed in or on the substrate. Each of the electrodes 210 are driven by one of a number of drive channels 216 in a driver 218, which may be integrally formed on the same substrate 208 with the linear array 202, as in the embodiment shown, or formed on a second substrate or chip and electrically coupled thereto (not shown).

A schematic sectional side view of a ribbon 204 of the SLM 200 of FIG. 2A is shown in FIG. 2B. Referring to FIG. 1B, the ribbon 204 includes an elastic mechanical layer 220 to support the ribbon above a surface 222 of the substrate 208, a conducting layer or electrode 210 and a reflective layer 224 including the reflective surface 206 overlying the mechanical layer and conducting layer.

Generally, the mechanical layer 220 comprises a taut silicon-nitride film, and is flexibly supported above the surface 222 of the substrate 208 by a number of posts or structures, typically also made of silicon-nitride, at both ends of the ribbon 204. The conducting layer or electrode 210 can be formed over and in direct physical contact with the mechanical layer 220, as shown, or underneath the mechanical layer. The conducting layer or electrode 210 can include any suitable conducting or semiconducting material compatible with standard MEMS fabrication technologies. For example, the conducting layer used for the electrode 210 can include a doped polycrystalline silicon (poly) layer, or a metal layer. Alternatively, if the reflective layer 224 is metallic it may also serve as the electrode 210.

The separate, discrete reflecting layer 224, where included, can include any suitable metallic, dielectric or semiconducting material compatible with standard MEMS fabrication technologies, and capable of being patterned using standard lithographic techniques to form the reflective surface 206.

In the embodiment shown, a number of ribbons are grouped together to form a large number of MEMS channels or pixels 226, each driven by a much smaller number of drive channels 216. Deflection of a ribbon 204 causes light reflected from the reflective surface 206 to constructively or destructively interfere with light reflected from the reflective surface of an adjacent ribbon, there enabling the pixel 226 to switch between an on or bright state, an off or dark state or an intermediate gray-scale. In particular, it is noted that gray-scale control of the MEMS based diffractors can provide a precise dosage of light from each pixel onto the surface of the workpiece to compensate for non-uniformities in light illuminating the SLM 200 or in modulated transmitted from the SLM to a surface of a workpiece through imaging optics.

Figure 2C:
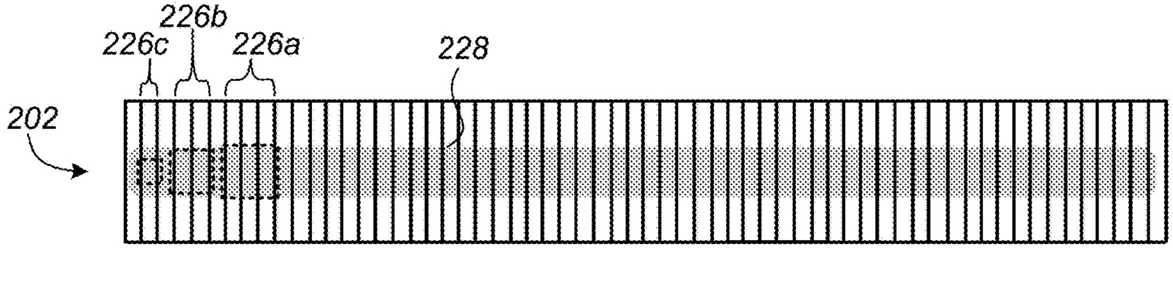

Referring to FIG. 2C in one embodiment suitable for laser marking systems, the linear array 202 includes 1088 individually addressable ribbons 204 that can be grouped together to form channels or pixels 226 having any number of ribbons depending on pixel size requirements. Additionally, the SLM can include drive channels 216 (shown in FIG. 2A) with up to 10-bit amplitude modulation to support gray-scale, and is capable of being modulated or switched at speeds up to 350 kHz. Referring again to FIG. 2C, shaded rectangle illustrates an illuminated area 228 on the linear array 202 illuminated by a rectangular beam directed onto the SLM 200. In some embodiments for laser marking systems, it is desirable to provide pixel configurations having a square aspect ratio. For example, in the embodiment shown wherein the linear array 202 includes about ribbons 204, each having a width of about 25 μm, and the illuminated area 228 has a width of about 75 μm, the ribbons can be grouped to form 360 square pixels 226*a* each including portions of three adjacent ribbons. Alternatively, the width of the illuminated area can be reduced to about 50 μm and the ribbons 204 can be grouped to form 512 50 μm×50 μm square pixels 226*b* each including portions of two adjacent ribbons, or the width of the illuminated area can be further reduced to about 25 μm such that each ribbon forms 1088 25 μm×25 μm square pixels 226*c*.

Advantages of the ribbon-type MEMS based SLM 200 include:

a. Linear array 202 pixel counts from about 1000 to about 8000 pixels 226;
b. Ability to modulate a wide range of laser wavelengths from 355 to 1064 nm, including about 514 nm;
c. Low mass and high tension of the ribbons 204 enable high speed switching of less than about 300 ns—up to ten times faster digital micro-mirror devices (DMDs) and a thousand times faster than liquid crystal on silicon (LCOS) devices;
d. Natural Analog gray-scale control of modulated light intensity, with amplitude resolution limited only by bit-depth of drive channels 216;
e. High power handling due to the ribbons 204 being made of silicon nitride, a robust, amorphous, high-temperature ceramic, with power densities up to and exceeding 10 kW/cm$^2$;
f. Non-contact, high reliability >10,000-hour lifetime demonstrated even under high-fluence UV illumination;
g. Borderless pixels with images being formed by spatially filtering the angularly modulated light, eliminating "screen door" effect of projected pixel images.

Another type of SLM including a multi-pixel, linear array of MEMS based two-dimensional (2D) diffractors, such as a Linear Planar Light Valve (LPLV™) commercially available from Silicon Light Machines, Inc., of San Jose, California, which is particularly advantageous for use in laser marking will now be described with reference to FIGS. 3A through 3C and FIG. 4.

For purposes of clarity, many of the details of fabricating and operating MEMS based two-dimensional (2D) diffractors, which are widely known and not relevant to the present invention, have been omitted from the following description. MEMS based 2D diffractors are described in greater detail, for example, in commonly assigned U.S. Pat. No. 7,064,883, entitled, "Two-Dimensional Spatial Light Modulator," by Alexander Payne et al., issued on Jun. 20, 2006, and incorporated herein by reference in its entirety.

Figure 3A:
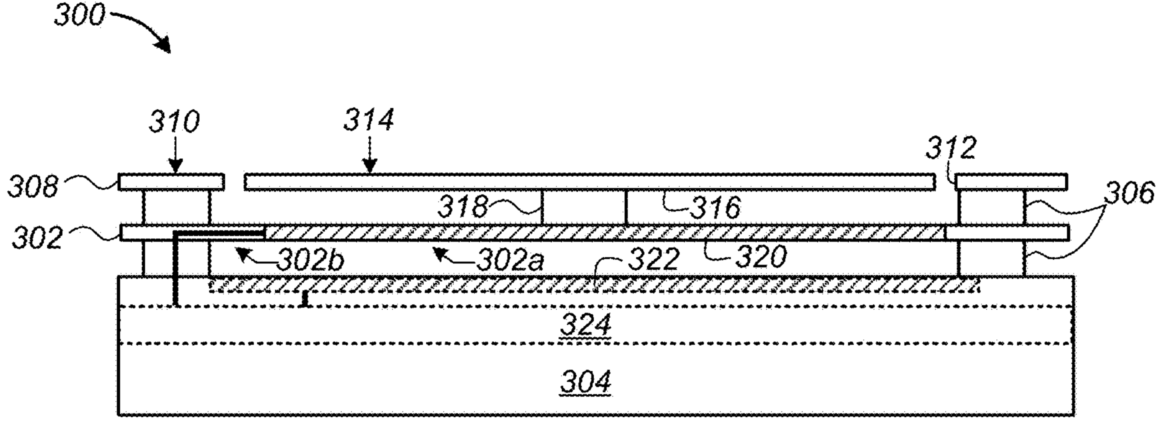
FIGS. 3A-3C are schematic block diagrams illustrating an embodiment of a SLM including MEMS based two-dimensional (2D) diffractors.

FIG. 3A illustrates a schematic block diagram of a sectional side view of a 2D modulator or diffractor 300 in a quiescent or un-driven state. Referring to FIG. 3A, the 2D diffractor 300 generally includes a piston layer 302 suspended over a surface of a substrate 304 by posts 306 at corners of the piston layer and/or 2D diffractor. The piston layer 302 includes an electrostatically deflectable piston 302*a* and a number of flexures 302*b* through which the piston is flexibly or movably coupled to the posts 306. A faceplate 308 overlying the piston layer 302 includes a first light reflective surface 310 and an aperture or cut-out portion 312 which separates the faceplate from a second reflective surface 314 on or attached to the piston 302*a*. The second light reflective surface 314 can either be formed directly on the top surface of the piston 302*a*, or, as in the embodiment shown, on a mirror 316 supported above and separated from the piston 302*a* by a central post 318 extending from the piston to the mirror. The first and second light reflective surfaces 310, 314, have equal area and reflectivity so that in operation electrostatic deflection of the piston 302*a* caused by an electrode 320 formed in or on the piston layer 302 and an electrode 322 in the substrate 304 brings light reflected from the first light reflective surface 310 into constructive or destructive interference with light reflected from the second light reflective surface 314.

Generally, the electrode 322 in the substrate 304 is coupled to one of a number drive channels in a drive circuit or driver 324, which can be integrally formed in the substrate adjacent to or underlying the 2D diffractor 300, as in the embodiment shown. The electrode 322 in the substrate 304 can be coupled to the driver 324 through a via extending through the substrate from the driver to the electrode, and the electrode 320 formed in or on the piston layer 302 can be coupled to the driver or an electrical ground through a conductor extending through one of the posts 306 and the piston layer. As explained in greater detail below, typically multiple individual 2D diffractors 300 are grouped or ganged together under control of a single drive channel to function as a single pixel in the multi-pixel, linear array of the SLM.

Figure 3B:
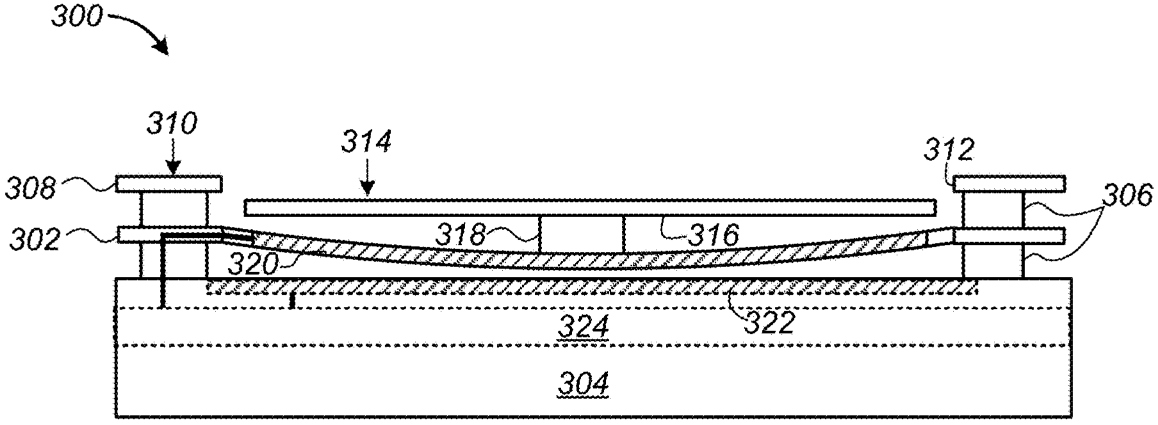
Figure 3C:
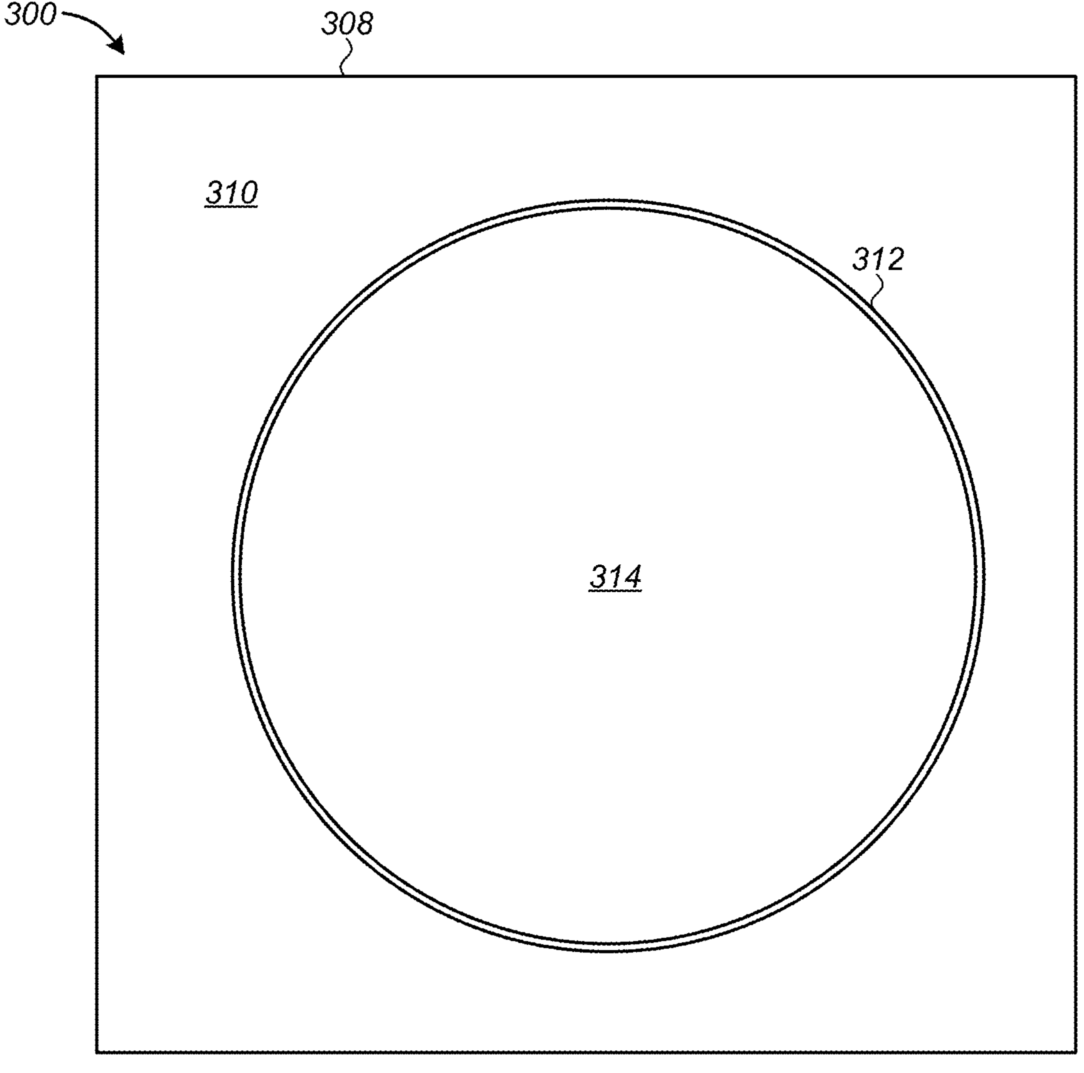

FIG. 3B is a schematic block diagram of the 2D diffractor 300 of FIG. 3A in an active or driven state, showing the piston 302*a* deflected towards the substrate 304, and FIG. 3C is a top view of the 2D diffractor of FIGS. 3A and 3B illustrating the static first light reflective surface 310 and the movable second light reflective surface 314.

Figure 4:
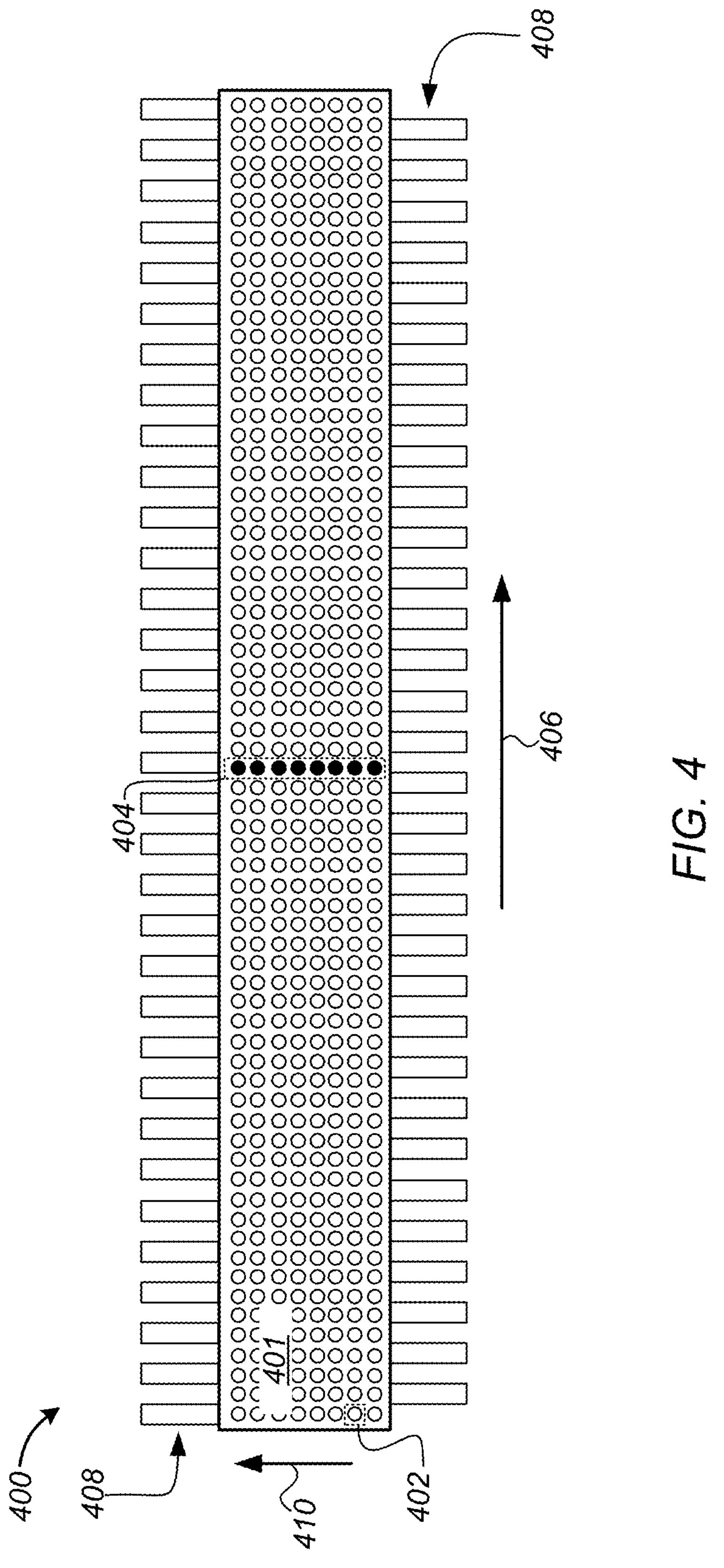
FIG. 4 is a schematic block diagram of a top view of an SLM including a multi-pixel, linear array of MEMS based 2D diffractors, such as those shown in FIGS. 3A-3C.

An exemplary multi-pixel, linear array of dense-packed, MEMS based 2D diffractors will now be described with reference to the block diagram of FIG. 4. FIG. 4 is a planar top view of a SLM 400 including a linear array 401 of 2D diffractors 402, such as those shown in FIGS. 3A-C, grouped or coupled together to a number of drive channels to or pixels.

Referring to FIG. 4, in one embodiment the 2D diffractors 402 are grouped into a linear array 401 of interleaved channels or pixels 404 along a first, horizontal or longitudinal axis 406. Each of the 2D diffractors 402 in a single pixel 404 share a common drive channel or driver 408. Although in the embodiment shown each pixel 404 is depicted as having a single column of 12 2D diffractors 402 grouped along a transverse or vertical or transverse axis 410 perpendicular to the horizontal or longitudinal axis 406 of the array, this is merely to facilitate illustration of the array. It will be appreciated that each channel or pixel can include any number of 2D diffractors arranged in one or more columns of any length across the width or vertical or transverse axis of the array without departing from the spirit and scope of the invention. For example, in one embodiment of the SLM 400 particularly suited for the spectral shaping systems and methods of the present disclosure, each pixel 404 includes a single column of 40 diffractors grouped along the transverse axis 410 of the array. Similarly, the SLM 400 can include an array 401 of any number of pixels 404 or a number of individual arrays 401 placed end to end adjacent to one another. This later configuration can help to increase power handling of the SLM 400 as the optically active area of the array 401 gets larger by increasing the number of columns of diffractors per pixel. If the damage threshold per diffractor is constant, power handling can be increased proportional to the area increase.

In order to maximize or provide sufficient contrast for the SLM 400 it is desirable that incident light from an illumination source, have a numerical aperture (NA) or cone angle ($\Theta$) which is smaller than the first-order diffraction angle ($\theta$) of the diffractive SLM 400. The diffraction angle ($\theta$) of the SLM is defined as the angle between light reflected from a pixel 404 in the $0^{th}$ order mode or state, and light reflected from the same pixel in the plus and/or minus $1^{st}$ order mode. However, according to the grating equation, diffraction angles of a periodic surface, such as the array 401 of the SLM 400, are set by a ratio of wavelength of light incident on the array to a spatial period or pitch of features of the periodic surface, i.e., the pixels 404. In particular, the grating equation states:

$$\sin\theta = m\lambda/\Lambda$$

where $\theta$ is a diffraction angle of light reflected from the surface, m is order of diffracted ray (integer), $\lambda$ is the wavelength of the incident light, and A is a spatial or pitch of the diffractor 402. When we focus on a single pixel which has multiple 2D diffractors 402 and the incident light is ideal plane wave or has a numeric aperture (NA)=0, the light spreads due to Huygen-Fresnel principle. The spreading angle $\Theta$ is defined:

$$\Theta = \lambda/D$$

where D is a pixel size.

Achieving adequate contrast with conventional grating based SLMs requires either limiting illumination NA by means of an aperture (and suffering the associated throughput loss), or providing a large diffraction angle by reducing the size and spatial period or pitch of the individual diffractors. However, this latter approach is problematic for a number of reasons including the need for larger, higher voltage drive circuits to drive smaller, movable grating elements, and a reduction of an optical power handling capability of the SLM resulting from such smaller grating elements.

In contrast to conventional grating based SLMs, a SLM 400 including MEMS-based, 2D diffractors 402, such as the LPLV™ is configured to have multiple pixels 404 each pixel including several 2D diffractors 402 arranged along the transverse or vertical axis 410 of the array (twelve in the embodiment shown), but with a much smaller number, generally only one or two diffractors, arranged along the horizontal or longitudinal axis 406. Because of this, the spreading angle $\Theta_H$ of diffracted light from the pixel 404 along the longitudinal axis, where the pixel size is much smaller than along the vertical or transverse axis, is much larger than the spreading angle $\Theta_V$ of the pixel along the transverse axis. Conversely, the numerical aperture of illumination in the vertical direction (array short axis) can be much larger than the numerical aperture in the horizontal direction (array long axis) since the latter is limited by the diffraction angle of the SLM in order to achieve sufficient contrast. Thus by using a linear array of 2D diffractors in combination with an asymmetric illumination NA in the longitudinal and transverse directions, the overall throughput of the spectral shaper can be improved.

Figures 5A, 5B:
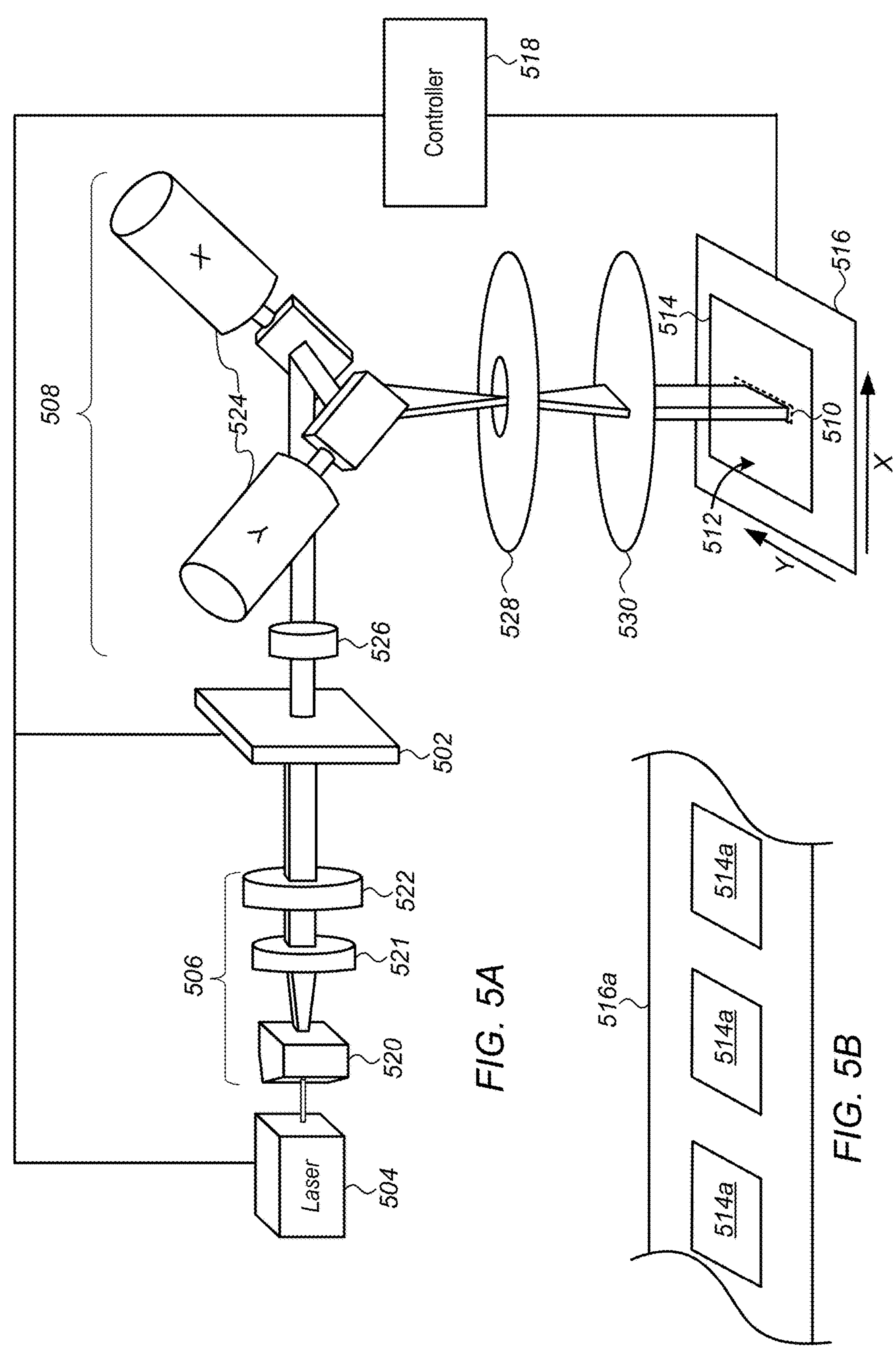
FIGS. 5A and 5B are schematic block diagrams of an embodiment of a laser marking system including an SLM with a multi-pixel, linear array of MEMS based diffractors, and galvanometric mirrors for scanning.

FIG. 5A is a schematic block diagram of an embodiment of a laser marking system 500 including an SLM 502 with a multi-pixel, linear array of MEMS based diffractors, and galvanometric mirrors for scanning. For purposes of clarity and to simplify the drawings the optical light path is shown as being unfolded causing the SLM 502 to appear as transmissive. However, it will be understood that because the SLM 502 is reflective the actual light path is folded to an angle of 90° or less at the SLM.

Referring to FIG. 5A, the laser marking system 500 includes, in addition to the SLM 502, a laser 504 operable to generate laser light used to illuminate the SLM, illumination optics 506 to direct laser light onto the SLM, imaging optics 508 operable to focus a substantially linear swath of modulated light 510 onto a surface 512 of a workpiece 514 on or affixed to a fixture 516 or stage, and a controller 518 operable to control the SLM, laser and imaging optics to scan the linear swath of modulated light across the surface of the workpiece to record a 2D image thereon.

As noted above, the laser 504 is capable of operating in UV wavelengths of from 355 nm through IR wavelengths up to about 2000 nm in either CW mode, or in a pulse mode with widths or durations of from about 1 fs up to about 500 ns at a repetition rate of from about 10 kHz up to about 300 kHz, and at energy ranges of from about 10 microjoules (μJ) up to greater than 10 millijoules (mJ).

The SLM 502 can include a multi-pixel; linear array of MEMS based, ribbon-type diffractors, such as shown in FIGS. 2A through 2C, or a multi-pixel, linear array of 2D diffractors, such as shown in FIGS. 3A through 3C and FIG. 4.

The illumination optics 506 can include a beam forming optical system to direct laser light onto the SLM 502. Referring to FIG. 5A, elements of the beam forming optical system can include a Powell lens 520, a long axis collimating lens 521, and a cylindrical, short axis focusing lens 522 to shape or focus the illumination into a rectangular beam or line of illumination extending substantially uniformly across the linear array of the SLM 502.

The imaging optics 508 can include galvanometric mirrors 524 to scan the linear swath of modulated light 510 across the surface 512 of the workpiece 514, a number of cylindrical lens 526 to direct modulated light to the galvanometric mirrors, and a Fourier aperture 528 to separate a $0^{th}$ order beam in the modulated light from $1^{st}$ order beams, and a Fourier Transform (FT) lens 530 to focus the modulated light onto the surface of the workpiece.

Preferably, the cylindrical lens 526 and FT lens 530 of the imaging optics include fused silica lenses to reduce thermal focus shift of the modulated light focused onto the surface 512 of a workpiece 514. In some embodiments, one or more of the lenses 520, 521, 522 of the illumination optics 506 can also include fused silica lenses to reduce thermal focus shift of the laser light focused onto the SLM 502.

The fixture 516 on which the workpiece 514 to be marked is placed or affixed can include a static fixture, or a movable stage operable to move or reposition the workpiece relative to a substantially stationary linear swath of modulated light, to scan the linear swath of modulated light across the surface of the workpiece. As noted above, in either embodiment, whether static or movable, the fixture 516 preferably includes a number of sensors and signaling means to signal other components in the laser marking system when the workpiece is in proper position to be marked.

In an alternative embodiment shown in FIG. 5B, the fixture 516 includes a movable belt **516*a* operable to move a number of individual parts or workpieces 514*a* past a focus of the 500 quickly and efficiently mark or record an image or images on a number of parts or workpieces. It will be understood that because a speed at which data can be loaded to the controller 518 for the SLM 502 is independent of and much greater than a speed at which the fixture 516 or belt 516*a* is moved and the image recorded, the laser system 500 can customize the image recorded on each individual part or workpiece 514/514*a***. Such images can include, for example, a serial number, part number, and data or a data sheet for the part.

Depending on the size of the linear swath of modulated light 510 and/or an image to be recorded it can be recorded on the surface 512 of a workpiece 514 in a single scan or single-stripe of the linear swath of modulated light 510 across the surface along a single axis, or by multiple scans or stripes (multi-stripes) of the linear swath of modulated light across the surface along a first axis perpendicular to a long axis of the linear swath of modulated light, followed by repositioning the linear swath of modulated light along a second axis parallel to the long axis of the linear swath.

Figures 6A, 6B, 6C:
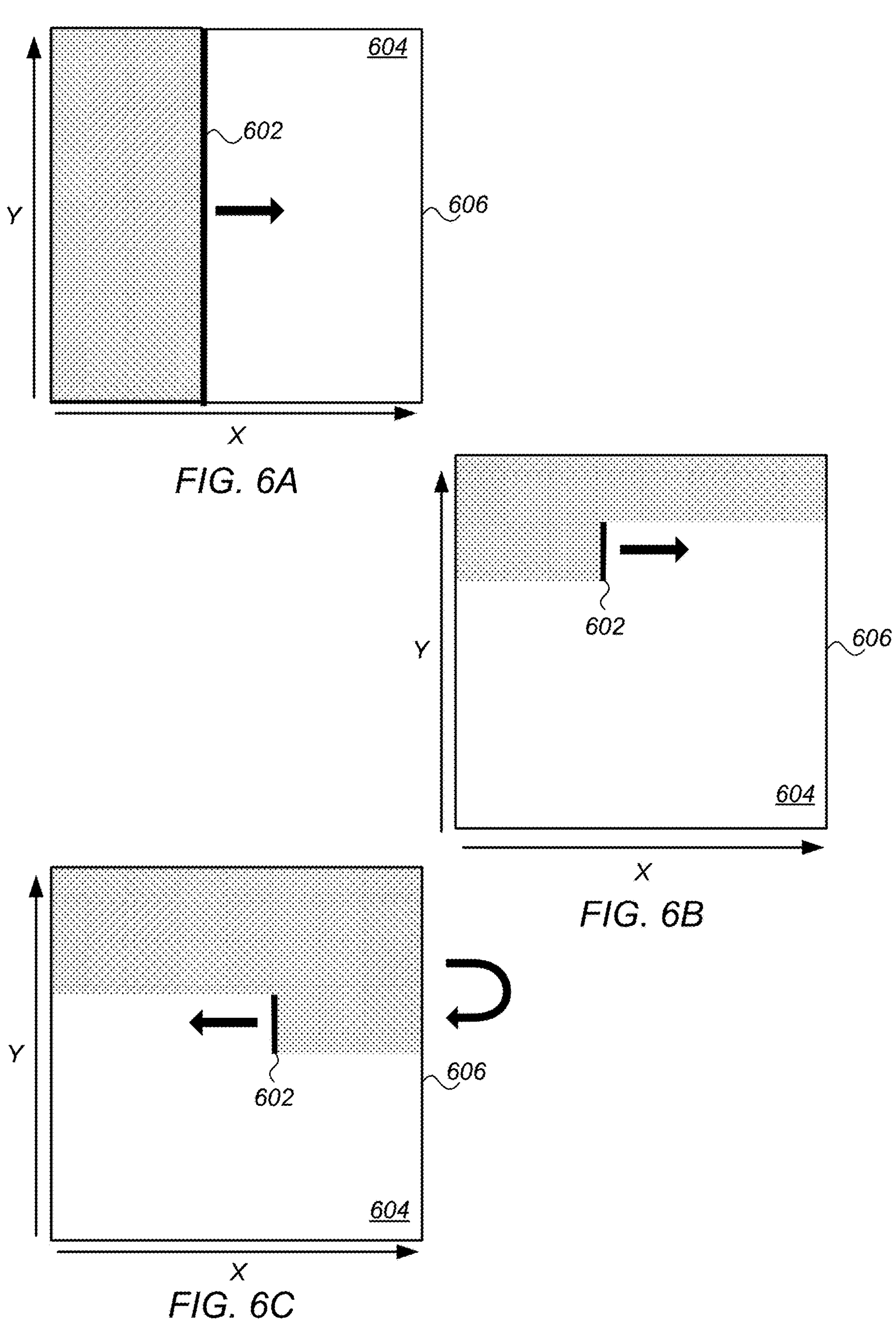
FIGS. 6A-6C are schematic block illustrating single-stripe and multi-stripe scanning using a laser marking system including an SLM with a multi-pixel, linear array of MEMS based diffractors for surface modification.

FIGS. 6A-6C are schematic block illustrating single-stripe and multi-stripe scanning using a laser marking system, such as that shown in FIGS. 5A and 5B.

FIG. 6A illustrates an embodiment of single-stripe scanning in which a linear swath of modulated light 602 is moved across a surface 604 of the workpiece 606 once in a single direction to record an image in a single pass or scan. It will be understood that this embodiment provides the shortest write-time, in some embodiments less than 1 second, and can reduce the complexity of the laser marking system by requiring only a single axis scanner in the X-direction. It is noted however that a laser marking systems using single-stripe scanning may require a higher energy laser of 1 millijoule or more, depending on a physical size of the pixels in the linear array of the SLM relative to the linear swath of modulated light 602 may have lower resolution and contrast than a multi-stripe system using a smaller or shorter linear swath of modulated light 602 and stitching together multiple scans or passes to form an image.

FIG. 6B illustrates an embodiment of multi-stripe scanning in which the linear swath of modulated light 602 is moved across the surface 604 of the workpiece 606 multiple times in the X-direction followed by indexing or repositioning the linear swath of modulated light in a Y-direction and repeating the scan in the same X-direction to record an image using multiple scans or passes stitched together. By stitched together it can mean either that the second and subsequent scans overlap the prior scan or that scans abut or adjoin one another on the surface 604 of the workpiece 606 substantially without overlapping. It will be understood that while this multi-stripe method has longer write-times than the single-stripe approach it is still significantly faster than the point-by-point method of prior laser marking systems using DMD or LCOS modulators. It will be further understood that the shorter long axis of the linear swath of modulated light 602 on enables the use of lower power lasers, while providing greater resolution and contrast in the recorded image.

FIG. 6C illustrates another embodiment of multi-stripe scanning in which the linear swath of modulated light 602 is not reset to an initial starting point on the X-axis prior to starting a second or subsequent scan, but rather reverses direction of the scan in the X-direction after indexing or repositioning the linear swath of modulated light in the Y-direction. It will be understood that this embodiment provides a shorter write-time than that of FIG. 6B by eliminating the need reposition an X-axis galvanometric mirror or a movable stage or fixture following completion of each scan in the X-direction, while proving the same improvement in resolution and contrast and enabling use of a lower power laser. As in the embodiment described with respect to FIG. 6B the multiple scans or passes can be stitched together in either overlapping or non-overlapping passes.

Figure 7:
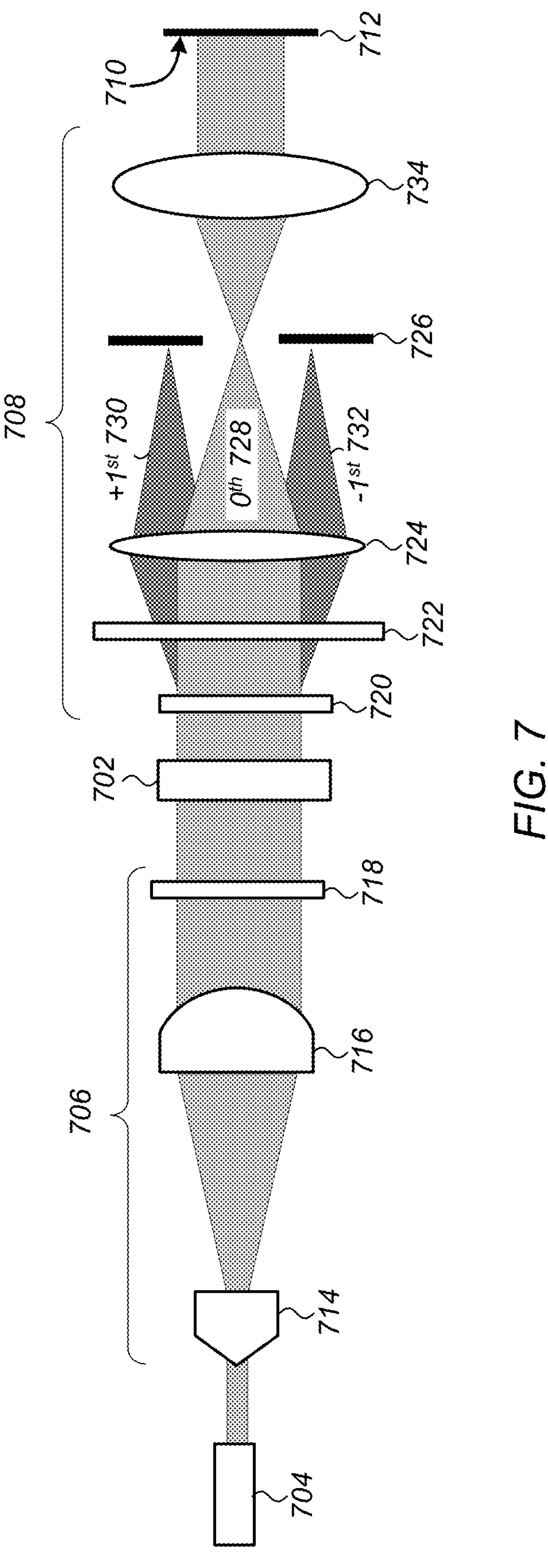
FIG. 7 is an optics diagram illustrating illumination and imaging light paths along a vertical or longitudinal axis of a linear array for a laser marking system including an SLM with a multi-pixel, linear array of MEMS based diffractors for surface modification.

FIG. 7 is an unfolded optics diagram illustrating illumination and imaging light paths along a vertical or longitudinal axis of a linear array for a laser marking system showing the separation of a $0^{th}$ order beam in the modulated light from $1^{st}$ order beams. For purposes of clarity and to simplify the drawings the optical light path is shown as being unfolded causing the SLM 702 to appear as transmissive. However, as noted above, it will be understood that because the SLM 702 is reflective the actual light path is folded to an acute angle at the SLM.

Referring to FIG. 7, the light path begins at a laser 704 and passes through anamorphic illumination optics 706, to illuminate a substantially linear portion of a linear array of the SLM 702, and imaging optics 708 to focus the modulated light onto a surface 710 of a workpiece 712. In some embodiments, such as that shown, the illumination optics 706 are anamorphic illumination optics and can include a Powell lens 714, a long axis collimating lens 716, and a cylindrical, short axis focusing lens 718 to shape or focus the illumination into a substantially rectangular beam or line of illumination extending substantially uniformly across the linear array of the SLM 702. The imaging optics 708 can include a number of cylindrical lens 720 to direct modulated light to one or more galvanometric mirrors 722, a first Fourier Transform (FT) lens 724, a Fourier aperture 726 to separate a $0^{th}$ order beam 728 in the modulated light from $\pm 1^{st}$ order beams 730, 732, and a second inverse Fourier Transform (FT) lens 734.

Figure 8:
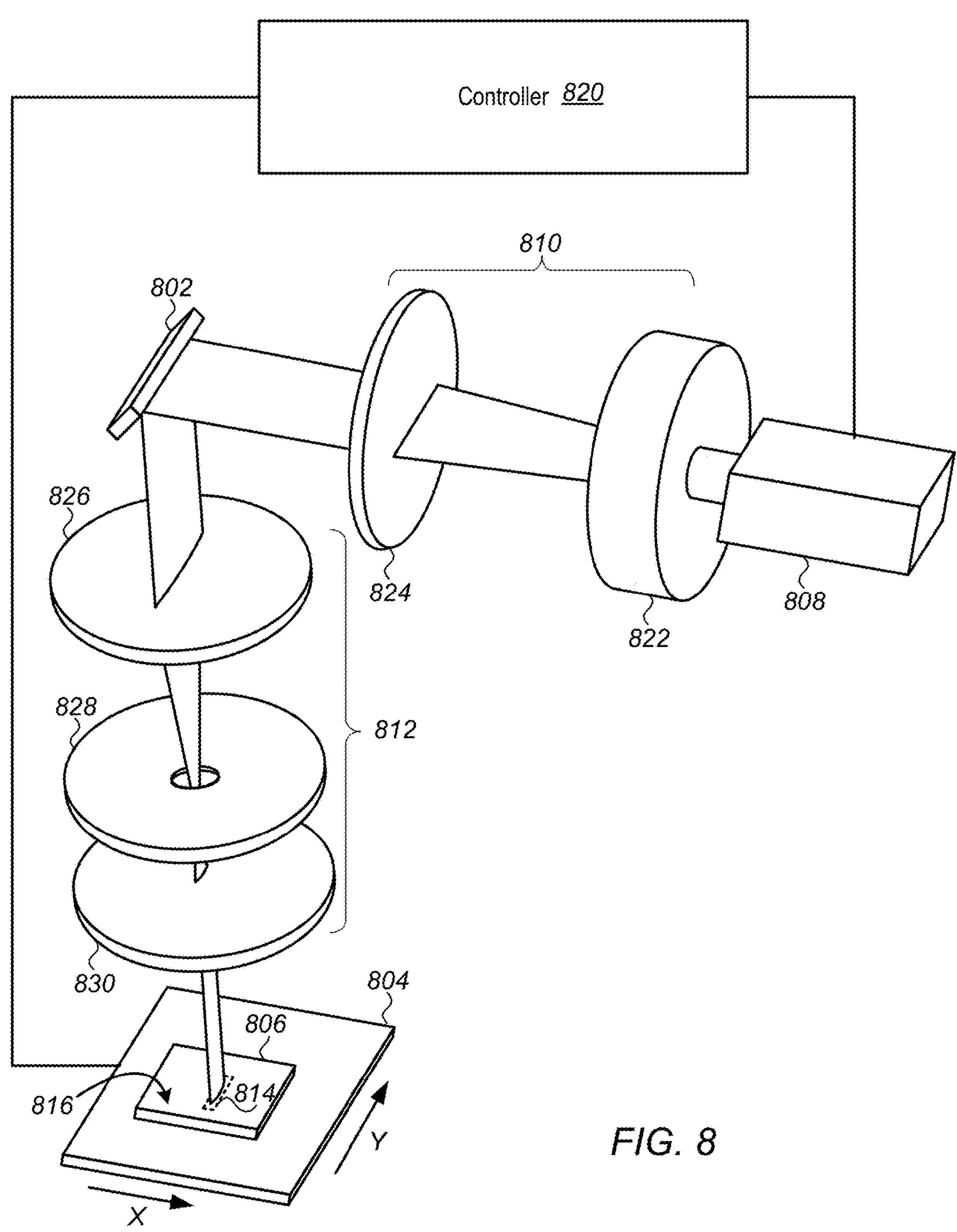
FIG. 8 is a schematic block diagram of an embodiment of a laser marking system including an SLM with a multi-pixel, linear array of MEMS based diffractors, and a moving fixture or stage to which a workpiece can be affixed.

FIG. 8 is a schematic block diagram of another embodiment of a laser marking system 800 including an SLM 802 with a multi-pixel, linear array of MEMS based diffractors, and a moving fixture or stage 804 to which a workpiece 806 can be affixed. Referring to FIG. 8, the laser marking system 800 further includes a laser 808 operable to generate laser light used to illuminate the SLM 802, illumination optics 810 to direct laser light onto the SLM, imaging optics 812 operable to focus a substantially linear swath of modulated light 814 onto a surface 816 of the workpiece 806 on or affixed to the movable fixture or stage 804, and a controller 820 operable to control the SLM, laser and movable stage to scan the linear swath of modulated light across the surface of the workpiece to record a 2D image thereon.

As noted above, the laser 808 is capable of operating in UV wavelengths of from 355 nm through IR wavelengths up to about 2000 nm in either CW mode, or in a pulse mode with widths or durations of from about 1 fs up to about 500 ns at a repetition rate of from about 10 kHz up to about 300 kHz, and at energy ranges of from about 10 microjoules (μJ) up to greater than 10 millijoules (mJ).

The SLM 802 can include a multi-pixel; linear array of MEMS based, ribbon-type diffractors, such as shown in FIGS. 2A through 2C, or a multi-pixel, linear array of 2D diffractors, such as shown in FIGS. 3A through 3C and FIG. 4.

The illumination optics 810 can include a beam forming optical system 822 to direct a substantially rectangular beam onto the SLM 802. Although not shown in this figure, elements of the beam forming optical system 822 can include a Powell lens and a long axis collimating lens, as shown in FIGS. 5 and 7. The illumination optics 810 can further include a cylindrical, short axis focusing lens 824 to direct or focus the rectangular beam substantially uniformly across the linear array of the SLM 802.

The imaging optics 812 can include a first Fourier Transform (FT) lens 826, a Fourier aperture 828 to separate a $0^{th}$ order beam in the modulated light from $\pm 1^{st}$ order beams, and a second inverse Fourier Transform (FT) lens 830 to focus the modulated light onto the surface 816 of the workpiece 806. As in the embodiments described above, the FT lenses 826, 830, of the imaging optics 812 can include fused silica lenses to reduce thermal focus shift of the modulated light focused onto the surface 816 of the workpiece 806. In some embodiments, one or more of the elements of the beam forming optical system 822 the focusing lens 824 of the illumination optics 810 can also include fused silica lenses to reduce thermal focus shift of the laser light focused onto the SLM 802.

The fixture or stage 804 on which the workpiece 806 to be marked is placed or affixed can move or at least along a first or X-axis relative to the stationary, substantially linear swath of modulated light 814 to perform a single-stripe scan as described above with reference to FIG. 6A. More preferably, the stages 804 is further operable to reposition the workpiece 806 held thereon relative to the linear swath of modulated light 814 along a second or Y-axis parallel to the long axis of the linear swath to perform one of the multi-stripe scans as described above with reference to FIGS. 6B and 6C.

Figure 9:
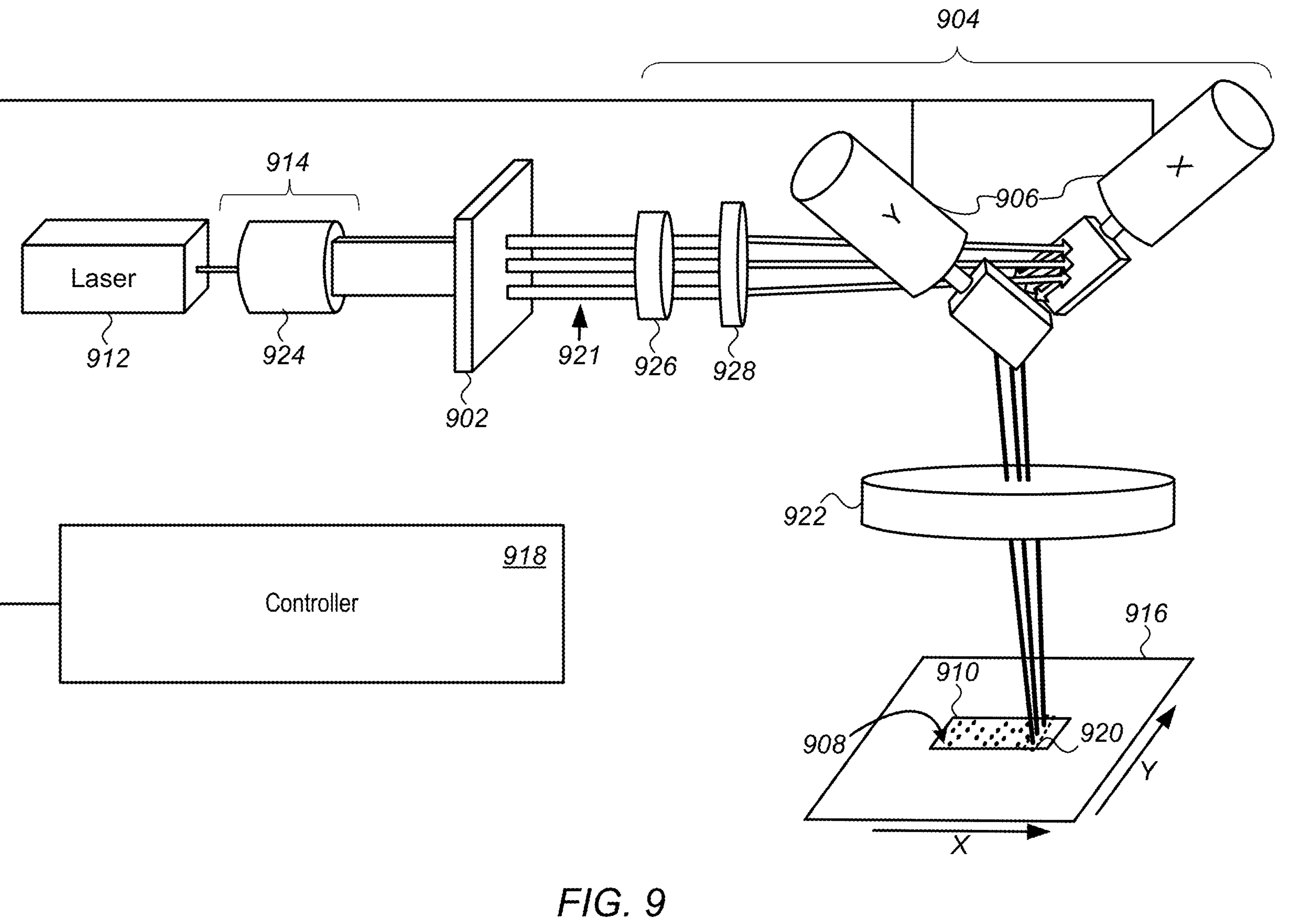
FIG. 9 is a schematic block diagram of another embodiment of a laser marking system including an SLM with a multi-pixel, linear array of MEMS based diffractors, and with focus before the galvanometric mirrors for scanning.

FIG. 9 is a schematic block diagram of another embodiment of a laser marking system 900 including an SLM 902 with a multi-pixel, linear array of MEMS based diffractors, and with imaging optics 904 including optical elements operable to focus a modulated light beam before the galvanometric mirrors 906 used to scan the modulated light beam across a surface 908 of a workpiece 910. As with the embodiment shown and described above with reference to FIGS. 5A and 5B, for purposes of clarity and to simplify the drawings the optical light path is shown as being unfolded causing the SLM 902 to appear as transmissive. However, it will be understood that because the SLM 902 is reflective the actual light path is folded to an angle of 90° or less at the SLM.

Referring to FIG. 9, the laser marking system 900 further includes a laser 912 operable to generate laser light used to illuminate the SLM 902, illumination optics 914 to direct laser light onto the SLM, a static fixture 916 on which the workpiece 910 to be marked is placed or affixed, and a controller 918 operable to control the SLM, laser and the galvanometric mirrors 906 to scan a swath of modulated light 920 across the surface 908 of the workpiece to record a 2D image thereon. It is noted that although modulated from the SLM 902 through the imaging optics 904 is shown as separate beams of modulated light or beamlets 921 to represent light and dark modulated light from individual pixels or groups of pixels, as in embodiments of the laser marking systems 500, 800, described above the imaging optic 904 of the laser marking system 900 are operable to illuminate a substantially linear or rectangular swath of modulated light 920 on the surface 908 of the workpiece 910. Optionally, as in the embodiment shown, the laser marking system 900 can further include a window 922 in an enclosure (not shown) enclosing the laser marking system to protect the galvanometric mirrors 906.

As noted above, the laser 912 is capable of operating in UV wavelengths of from 355 nm through IR wavelengths up to about 2000 nm in either CW mode, or in a pulse mode with widths or durations of from about 1 fs up to about 500 ns at a repetition rate of from about 10 kHz up to about 300 kHz, and at energy ranges of from about 10 microjoules (μJ) up to greater than 10 millijoules (mJ).

As also noted above, the SLM 902 can include a multi-pixel; linear array of MEMS based, ribbon-type diffractors, such as shown in FIGS. 2A through 2C, or a multi-pixel, linear array of 2D diffractors, such as shown in FIGS. 3A through 3C and FIG. 4.

The illumination optics 914 can include a beam forming optical system 924 to form and direct a substantially rectangular beam substantially uniformly across the linear array of the SLM 902. Although not shown in this figure, elements of the beam forming optical system 924 can include a Powell lens and a long axis collimating lens, as shown in FIGS. 5 and 7.

In accordance with the present embodiment the imaging optics 904 include a first focusing cylinder lens 926 located before the galvanometric mirrors 906 to focus light along an X-axis at the surface 908 of the workpiece 910, where the X-focus determines a width of the swath of modulated light 920, and a second focusing cylinder lens 928 to focus light along a Y-axis, where the Y-focus determines a height of the swath of modulated light.

Finally, as in the embodiments described above, the lenses 926, 928, of the imaging optics 904 can include fused silica lenses to reduce thermal focus shift of the modulated light focused onto the surface 908 of the workpiece 910. In some embodiments, one or more of the elements of the beam forming optical system 924 of the illumination optics 914 can also include fused silica lenses to reduce thermal focus shift of the laser light focused onto the SLM 902.

Figure 10:
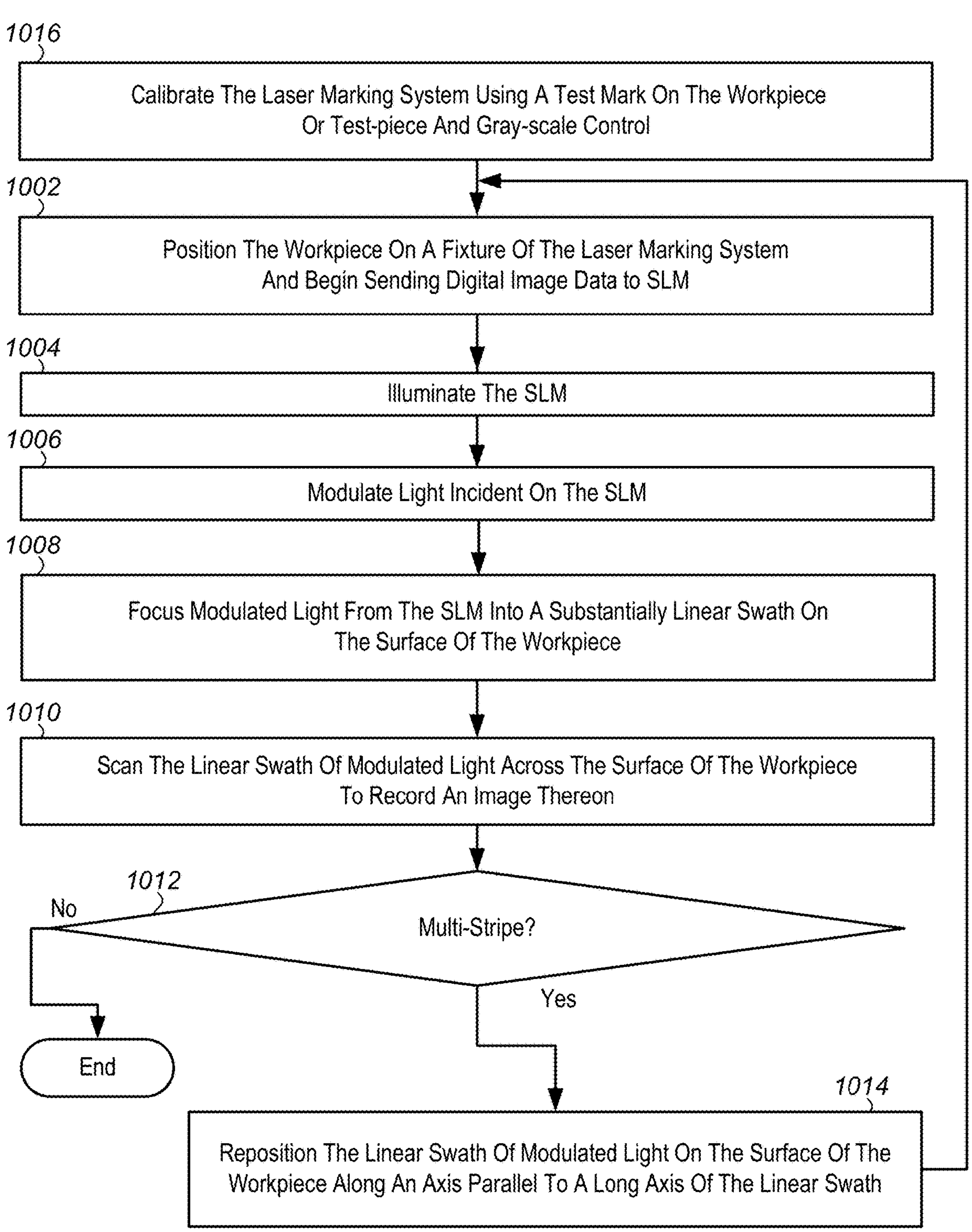
FIG. 10 is a flowchart of a method of modifying or marking a surface using a surface modification system including a MEMS based SLM.

FIG. 10 is a flowchart of a method for modifying or marking a surface using a laser marking system including a MEMS based SLM. Referring to FIG. 10, the method begins with positioning a workpiece on a fixture of a laser marking system, and beginning to send digital image data to a SLM of the laser marking system (1002). When it has been detected that the workpiece is positioned on the fixture, digital image data received by the SLM, and the diffractors settled, generating light from a laser (1004). Generally, this can be accomplished by sending a pulse of the appropriate duration to the laser through a control bus. Next, light from the laser is optically coupled to the SLM to substantially uniformly illuminate a linear array of the SLM, and light incident on the SLM modulated (1006). Modulated light from the SLM is then projected and focused into a substantially linear swath on a surface of the workpiece using imaging optics; the linear swath includes light from multiple pixels of the SLM (1008). Next, the laser, SLM, and a scanner or galvanometric mirrors in the imaging optics operated to scan the linear swath of modulated light across the surface of the workpiece to record an image thereon (1010). It is then determined if a multi-stripe is necessary or desired (1012). If a multi-stripe is not necessary, i.e., if a single-stripe scan is sufficient to record the desired image, the process ends. If a multi-stripe is necessary, due either to a size of the image, a length of the linear swath of modulated light, or a desired resolution or contrast in the image recorded, the linear swath of modulated light is repositioned or indexed on the surface of the workpiece along an axis parallel to a long axis of the linear swath (1014) and the process repeated.

Optionally, as in the embodiment shown in FIG. 10, the method can further include an initial calibration step (step 1016), in which the laser marking system is calibrated using test mark or pattern either on the workpiece or a test-piece positioned on the fixture, adjusting a for each pixel a precise dosage of light projected onto the workpiece using gray-scale control of modulated light intensity to calibrate for non-uniformities in the light. Evaluation of the test mark can be accomplished either manually by a user of the laser marking system or automatically using a scanner or camera integrated into the system.

Figure 11A:
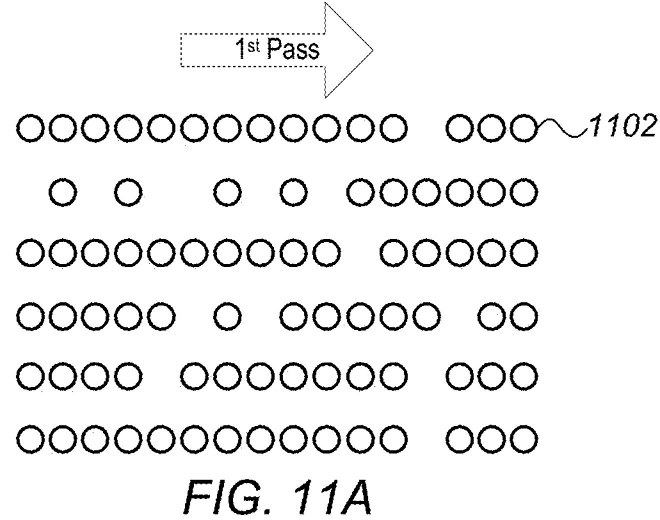
FIGS. 11A through 11C are schematic block illustrating a method of modifying or marking a surface using interleaving of two or more scans of the surface.
Figure 11B:
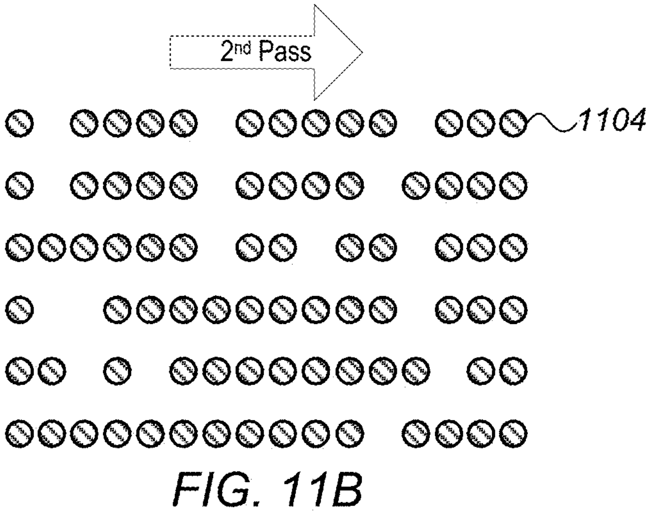
Figure 11C:
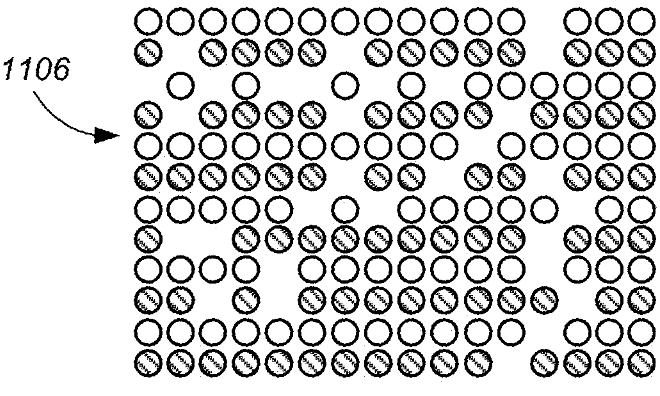

FIGS. 11A through 11C are schematic block diagrams illustrating a method of modifying or marking a surface using interleaving of two or more scans of the surface. 20. Referring to FIG. 11A the method begins with controlling the laser, SLM, and imaging optics of the laser marking system to scan a linear swath of modulated light across the surface of the workpiece in a $1^{st}$ pass to mark a first number of spots 1102 in first locations, and, referring to FIG. 11B, at a second time in a $2^{nd}$ pass to mark a second number of spots 1104 in second locations, interleaved with the first locations to record a desired image 1106, as shown in FIG. 11C. In these figures, the SLM modulates along a vertical or Y-direction, while the workpiece is scanned in a horizontal or X-direction. It will be understood this is method reduces a thermal load on the SLM and imaging optics.

Figure 12A:
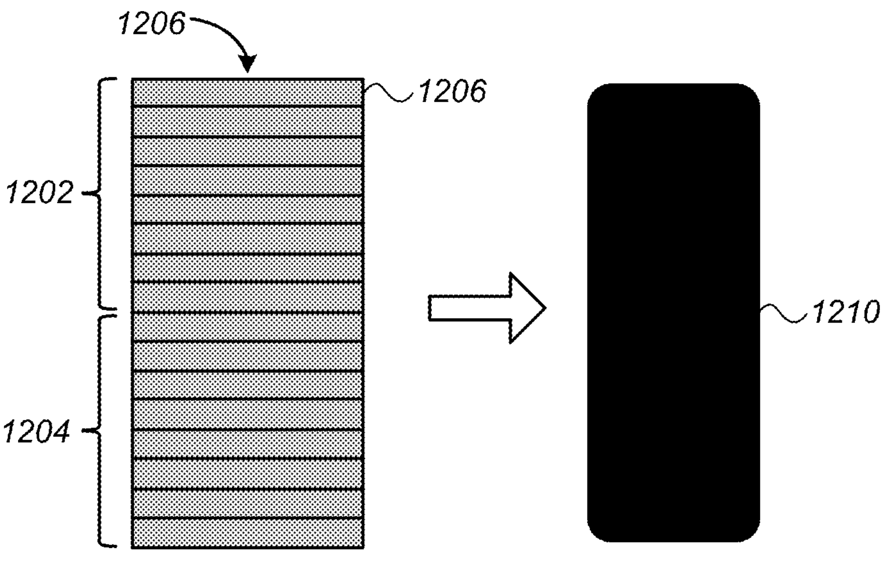
FIGS. 12A and 12B are schematic block diagrams two adjacent groups of eight pixels in a linear array of MEMS based 2D diffractors illustrating a pixel shaping method for recording an image with a high density pattern.
Figure 12B:
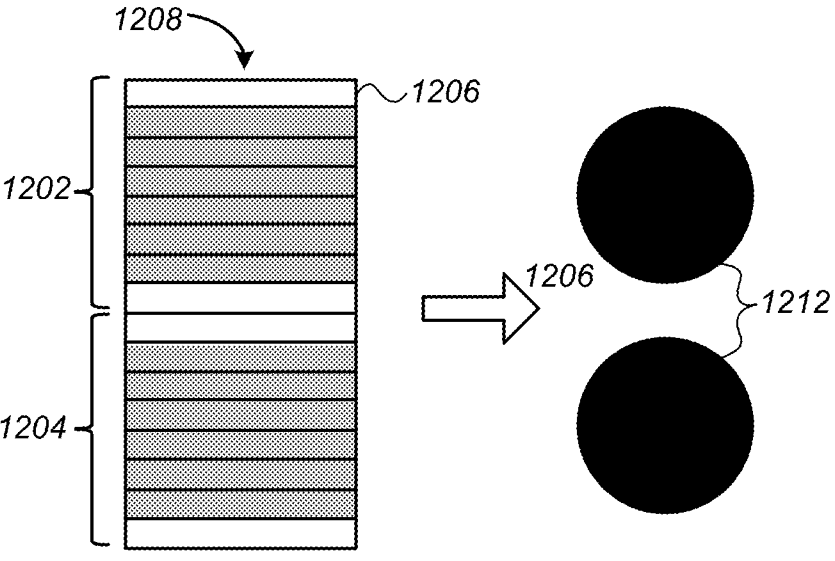

In another embodiment, the method can further include pixel shaping to improve resolution in images having high density patterns. FIGS. 12A and 12B are schematic block diagrams two adjacent groups 1202, 1204 of eight pixels 1206 in a linear array 1208 of MEMS based 2D diffractors, such as an LPLV™, illustrating a pixel shaping method for recording an image with a high density pattern. Referring to FIG. 12A it is seen that when all eight pixels 1206 in adjacent groups 1202, 1204, are on in an attempt to record adjacent dots on a surface of a workpiece, crosstalk between the groups of pixels result in a printed line 1210 rather than the desired adjacent dots. By turning off adjacent pixels 1206 between the adjacent groups 1202, 1204, resolution is improved resulting in the desired adjacent dots 1212, as shown in FIG. 12B.

Thus, embodiments of a laser marking system including a spatial light modulator (SLM) with a multi-pixel, linear array of MEMS based diffractors, and systems using the same have been described. Embodiments of the present invention have been described above with the aid of functional and schematic block diagrams illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

It is to be understood that the Detailed Description section, and not the Summary and Abstract sections, is intended to be used to interpret the claims. The Summary and Abstract sections can set forth one or more but not all exemplary embodiments of the present invention as contemplated by the inventor(s), and thus, are not intended to limit the present invention and the appended claims in any way.

The breadth and scope of the present invention should not be limited by any of the above-described exemplary embodiments, but should be defined only in accordance with the following claims and their equivalents.

The invention claimed is:

1. A laser marking system comprising:

a spatial light modulator (SLM) comprising a multi-pixel, linear array of microelectromechanical systems (MEMS) based diffractors;

a laser operable to illuminate the SLM;

imaging optics operable to focus a linear swath of modulated light onto a surface of a workpiece, the linear swath comprising light from multiple pixels of the SLM; and a controller operable to control the SLM, laser and imaging optics to mark the surface of the workpiece to record an image thereon, wherein the controller is operable to provide gray-scale control of the MEMS based diffractors to provide a precise dosage of light from each pixel onto the surface of the workpiece to compensate for non-uniformities in light illuminating the SLM or in modulated transmitted from the SLM through the imaging optics.

2. The laser marking system of claim 1 wherein each of the MEMS based diffractors comprises a number of electrostatically deflectable ribbons suspended over a substrate, each ribbon having a light reflective surface, wherein electrostatic deflection of the number of electrostatically deflectable ribbons brings light reflected from the light reflective surface of a first electrostatically deflectable ribbon into interference with light reflected from the light reflective surface of a second electrostatically deflectable ribbon.

3. The laser marking system of claim 1 wherein each of the MEMS based diffractors comprises:

a piston layer suspended over a surface of a substrate by posts at corners thereof, the piston layer including an electrostatically deflectable piston and a number of flexures through which the piston is coupled to the posts;

a first reflective surface over a top surface of the piston; and a faceplate suspended over the piston layer, the faceplate including a second reflective surface on a top surface of the faceplate, and an aperture through which the piston exposed, wherein electrostatic deflection of the piston brings light reflected from the first reflective surface into interference with light reflected from the second reflective surface.

4. The laser marking system of claim 1 wherein the imaging optics comprise a number of galvanometric mirrors, and wherein the controller is operable to control the number of galvanometric mirrors to scan the linear swath of modulated light across the surface of the workpiece to record a two-dimensional (2D) image thereon.

5. The laser marking system of claim 1 further including a fixture to which the workpiece is positioned, and wherein the controller is operable to control the fixture to provide relative motion between the fixture and linear swath of modulated light to scan the linear swath of modulated light across the surface of the workpiece to record a two-dimensional (2D) image thereon.

6. The laser marking system of claim 5 wherein fixture comprises a movable stage on which a multiple workpieces are positioned, and the controller is operable to move the multiple workpieces on the movable stage through an area of a focus of the imaging optics to sequentially record images thereon, and wherein the images recorded on each of the multiple workpieces can be different.

7. The laser marking system of claim 1 wherein the SLM is operable to send a signal to the laser when image data loaded to the SLM from the controller is ready to be recorded on to the workpiece so that the laser can be pulsed.

8. The laser marking system of claim 5 wherein the fixture is operable to send a signal to one or more of the controller, the SLM or the laser when the workpiece is in proper position to record an image thereon.

9. A laser marking system comprising:

a spatial light modulator (SLM) comprising a multi-pixel, linear array of microelectromechanical systems (MEMS) based diffractors;

a laser operable to illuminate the SLM;

imaging optics operable to focus a linear swath of modulated light onto a surface of a workpiece, the linear swath comprising light from multiple pixels of the SLM; and a controller operable to control the SLM, laser and imaging optics to mark the surface of the workpiece to record an image thereon, wherein the imaging optics comprise a number of galvanometric mirrors, and wherein the controller is operable to control the number of galvanometric mirrors to scan the linear swath of modulated light across the surface of the workpiece to record a two-dimensional (2D) image thereon, and wherein the imaging optics comprise a number of cylindrical lenses to focus modulated light from the SLM onto the number of galvanometric mirrors, and a focus lens to focus the linear swath of modulated light from the number of galvanometric mirrors onto the surface of the workpiece.

10. The laser marking system of claim 9 wherein the controller is operable to after scanning the linear swath of modulated light a predetermined distance across the surface of the workpiece in a first direction, to reposition the linear swath in a second direction perpendicular to the first direction, and repeat the scanning of the linear swath of modulated light across the surface of the workpiece by the predetermined distance in a third direction parallel and opposite to the first direction.

11. A laser marking system comprising:

a laser;

a spatial light modulator (SLM) comprising a multi-pixel, linear array of microelectromechanical systems (MEMS) based diffractors;

illumination optics operable to illuminate the SLM with light from the laser, the illumination optics including a beam forming optical system to direct a rectangular beam onto the SLM;

imaging optics operable to focus a linear swath of modulated light onto a surface of a workpiece, the imaging optics comprising:

a first cylindrical lens to focus modulated light from the SLM in an X focal plane at the surface of the workpiece;

a second cylindrical lens to focus modulated light from the SLM in an Y focal plane, wherein an Y-focus determines a swath height of the linear swath of modulated light on the surface of the workpiece; and a number of galvanometric mirrors disposed in a light path between the first and second cylindrical lenses and the surface of the workpiece; and a controller operable to control the laser, SLM, and the number of galvanometric mirrors to scan the linear swath of modulated light across the surface of the workpiece to record a two-dimensional (2D) image thereon.

12. The laser marking system of claim 11 wherein each of the MEMS based diffractors comprises a number of electrostatically deflectable ribbons suspended over a substrate, each ribbon having a light reflective surface, wherein electrostatic deflection of the number of electrostatically deflectable ribbons brings light reflected from the light reflective surface of a first electrostatically deflectable ribbon into interference with light reflected from the light reflective surface of a second electrostatically deflectable ribbon.

13. The laser marking system of claim 11 wherein each of the MEMS based diffractors comprises:

a piston layer suspended over a surface of a substrate by posts at corners thereof, the piston layer including an electrostatically deflectable piston and a number of flexures through which the piston is coupled to the posts;

a first reflective surface over a top surface of the piston; and a faceplate suspended over the piston layer, the faceplate including a second reflective surface on a top surface of the faceplate, and an aperture through which the piston exposed, wherein electrostatic deflection of the piston brings light reflected from the first reflective surface into interference with light reflected from the second reflective surface.

14. The laser marking system of claim 11 wherein the imaging optics further comprises a window disposed in a light path between the number of galvanometric mirrors and the surface of the workpiece.

15. The laser marking system of claim 11 further comprising a movable stage on which a multiple workpieces are positioned, and the controller is operable to move the multiple workpieces on the movable stage past a focus of the imaging optics to sequentially record 2D images thereon, and wherein the images recorded on each of the multiple workpieces can be different.

16. The laser marking system of claim 11 wherein the controller is operable to after scanning the linear swath of modulated light a predetermined distance across the surface of the workpiece in a first direction, to reposition the linear swath in a second direction perpendicular to the first direction, and repeat the scanning of the linear swath of modulated light across the surface of the workpiece by the predetermined distance in a third direction parallel and opposite to the first direction.

17. A laser marking system comprising:

a fixture on which a workpiece having a surface to be marked is positioned;

a spatial light modulator (SLM) comprising a multi-pixel, linear array of microelectromechanical systems (MEMS) based diffractors;

a laser operable to illuminate the SLM;

imaging optics operable to focus a linear swath of modulated light onto the surface of the workpiece, the linear swath comprising light from multiple pixels of the SLM;

a controller operable to load image data to the SLM, position the fixture, and to control the SLM, laser and imaging optics to mark the surface of the workpiece to record an image thereon, wherein the SLM is operable to signal the laser when image data loaded to the SLM is ready to be recorded on to the workpiece so that the laser can be pulsed, and wherein the fixture includes a number of sensors to signal one or more of the controller, the SLM or the laser when the workpiece is in proper position to record an image thereon.

18. The laser marking system of claim 17 wherein the controller is operable to provide gray-scale control of the MEMS based diffractors to provide a precise dosage of light from each pixel onto the surface of the workpiece to compensate for non-uniformities in light illuminating the SLM or in modulated transmitted therefrom through the imaging optics.

* * * * *